(12) United States Patent
Karavanic et al.

(10) Patent No.: US 8,680,885 B1
(45) Date of Patent: Mar. 25, 2014

(54) LOW LEAKAGE LOGIC CIRCUIT

(71) Applicants: Valter Karavanic, Nashua, NH (US); Gary Hau, Westford, MA (US)

(72) Inventors: Valter Karavanic, Nashua, NH (US); Gary Hau, Westford, MA (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 13/686,002

(22) Filed: Nov. 27, 2012

Related U.S. Application Data

(60) Provisional application No. 61/566,433, filed on Dec. 2, 2011.

(51) Int. Cl.
*H03K 17/16* (2006.01)
*H03K 19/003* (2006.01)
*H03K 19/23* (2006.01)

(52) U.S. Cl.
USPC ............... 326/33; 326/31; 326/34; 326/26

(58) Field of Classification Search
None
See application file for complete search history.

(56) References Cited

U.S. PATENT DOCUMENTS

2011/0074512 A1* 3/2011 Alon et al. ............... 330/296
2011/0175644 A1* 7/2011 Matano ...................... 326/33

* cited by examiner

*Primary Examiner* — Anh Tran
(74) *Attorney, Agent, or Firm* — William L. Botjer

(57) ABSTRACT

A low leakage logic circuit. The low leakage logic circuit includes a control circuit for logic circuit. The control circuit has a first transistor, a second transistor, a third transistor, a first diode, a first resistor and a second resistor. When the control circuit is ON, a first circuit path in the logic circuit is supplied with a first voltage from the source terminal of the third transistor. This voltage acts as a logic output and has the ability to source current at output terminal of the logic circuit. When the control circuit is OFF, a second circuit path in the logic circuit is supplied with a second voltage from the control circuit which is lower than the turn-on voltage of the second circuit path. This voltage is insufficient to turn ON the logic circuit, hence no current flows into the logic circuit.

18 Claims, 9 Drawing Sheets

LOW LEAKAGE LOGIC CIRCUIT

CROSS REFERENCE TO RELATED APPLICATION

This application claims priority from the U.S. provisional application No. 61/566,433 titled: "LOW LEAKAGE LOGIC CIRCUIT" filed on Dec. 2, 2011, the disclosure of which is hereby incorporated by reference.

TECHNICAL FIELD

The present invention generally relates to field of digital circuits. More specifically, the present invention relates to control circuits for logic circuits.

BACKGROUND OF THE INVENTION

In the current state of technology, digital circuits are designed to address the increasing concern of controlling leakage current; especially when low current usage in the digital logic circuit is desired. High leakage current may result in reduced device operating time in the case of battery-powered devices. Therefore, there is a need for low leakage logic circuits.

A conventional 1.8V logic circuit, in the form of an inverter may be used as the low leakage logic circuit. The 1.8V low leakage logic circuit can be designed by connecting two Gallium Arsenide Hetero-junction Bipolar Transistors (GaAs HBTs) in a double inverter type logic circuit (hereafter referred to as Double Inverter Circuit). The double inverter circuits that are compatible with CMOS circuitry may be used to provide control voltages for high power Radio Frequency (RF) front-end transmitters.

FIG. 1 illustrates a prior art double inverter circuit 100. Double inverter circuit 100 includes a first transistor 105 and a second transistor 115. A first transistor 105 and a first resistor 110 connected as shown form a first circuit path. Similarly, a second transistor 115 and a second resistor 120 connected as shown form a second circuit path. When control voltage $V_{ctrl}$ is high, second transistor 115 turns ON which causes all current from the supply voltage to flow through second transistor 115 to ground. Thus, first transistor 105 turns (or remains) OFF. Therefore, the output of double inverter circuit 100 at output terminal 130 is high ($V_{cc}$ — voltage drop across first resistor 110), resulting in an ON state of double inverter circuit 100. Output terminal 130 supplies logic voltage and bias current to any circuit (not shown) connected.

Similarly, when the control voltage $V_{ctrl}$ is low, first transistor 105 turns on and double inverter circuit 100 operates in the OFF-state providing no voltage at output terminal 130. Since, first transistor 105 is ON, it will conduct a small amount of current (corresponds to the leakage current) which is not desirable in the OFF-state operation of double inverter circuit 100.

In this prior art implementation, this leakage current is controlled by first resistor 110 and second resistor 120, which are connected to the collector terminals of first transistor 105 and second transistor 115 respectively. In order to maintain very low leakage current (<3 μA) in double inverter circuit 100, the values of first resistor 110 and second resistor 120 need to be in the mega Ohm (>1 MΩ) range or higher. This requirement places a limit on the current available from output terminal 130 of the double inverter circuit 100. In applications, such as high power switch bias in RF front-end transmitters, where high bias current might be required, the systems will fail to operate properly due to limited current sourcing capability from the double inverter circuit 100. In addition, the leakage current will increase proportionally with the number of logic circuits used in the systems.

In view of the foregoing, an advanced low leakage logic circuit is desirable that addresses the limitations of the standard CMOS compatible low leakage logic circuits.

SUMMARY OF THE INVENTION

According to embodiments illustrated herein, there is provided a control circuit for a logic circuit. The control circuit for the logic circuit receives a control signal at a control input terminal and provides a first voltage and a second voltage to the logic circuit. The control circuit includes a first transistor and a first resistor, wherein the base terminal of the first transistor is connected to the control input terminal, the collector terminal of the first transistor is connected to a supply voltage source through the first resistor, and the emitter terminal of the first transistor is grounded. The control circuit also includes a second transistor and a second resistor, wherein the base terminal of the second transistor is connected to the collector terminal of the first transistor, the collector terminal of the second transistor is connected to the supply voltage source through the second resistor, and the emitter terminal of the second transistor is grounded.

The control circuit further includes a third transistor, the gate terminal of the third transistor is connected to the collector terminal of the second transistor, the drain terminal of the third transistor is connected to the supply voltage source, and the source terminal of the third transistor supplies the first voltage to the logic circuit.

Furthermore the control circuit includes a voltage drop component, wherein an input terminal of the voltage drop is connected to the source terminal of the third transistor, and an output terminal of the voltage drop component supplies the second voltage to the logic circuit, wherein the magnitudes of the first voltage and second voltage are such that the logic circuit conducts no current when the logic circuit operates in OFF state.

When the control circuit is in an OFF state, the logic circuit will draw no current. However, when the control circuit is in an ON state, the first voltage from the control circuit can provide sufficient current to the logic circuit to bias any circuit, such as an RF switch, connected to the logic circuit. The leakage current is determined by the control circuit whereas the first and second resistors of the control circuit are optimized for low leakage current without affecting the current sourcing capability of the logic circuit. In addition, the leakage current is independent of the total number of the logic circuits connected to the control circuit.

BRIEF DESCRIPTION OF THE DRAWINGS

The detailed description of the embodiments of the invention will hereinafter be described in conjunction with the appended drawings provided to illustrate and not to limit the invention, wherein like designations denote like elements, and in which.

DESCRIPTION OF THE PREFERRED EMBODIMENTS

The invention can be best understood with reference to the detailed figures and description set forth herein. Various embodiments are discussed below with reference to the figures. However, those of ordinary skill in the art will readily appreciate that the detailed description given herein with respect to these figures are just for explanatory purposes. The disclosed systems extend beyond the described embodiments. For example, those of ordinary skill in the art will appreciate that in light of the teachings presented, multiple alternate and suitable approaches may be realized, to implement the functionality of any detail described herein, beyond the particular implementation choices in the following embodiments described and shown.

Figure 2:
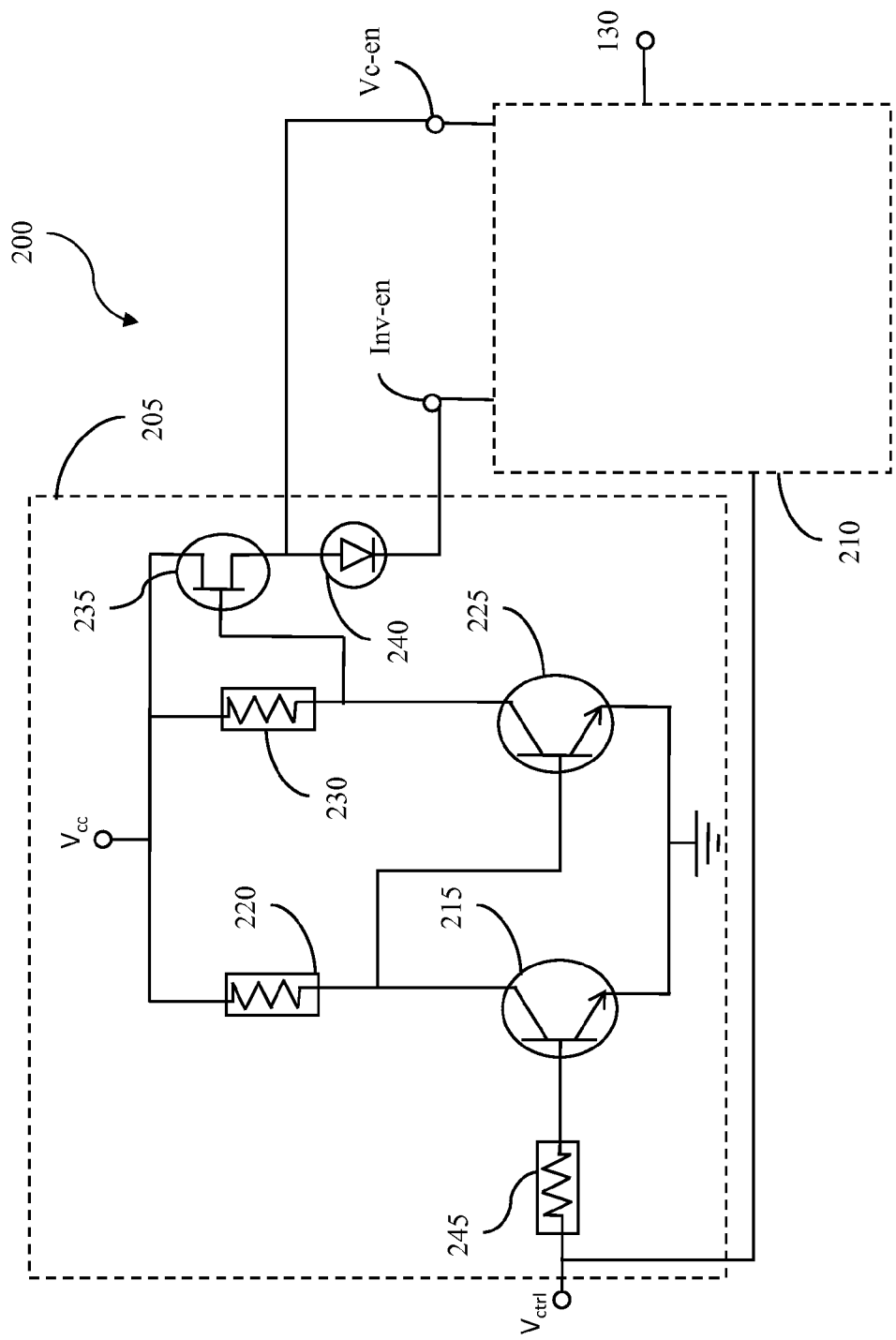
FIG. 2 illustrates a low leakage logic circuit in accordance with an embodiment of the invention.

FIG. 2 illustrates a low leakage logic circuit 200 in accordance with an embodiment of the invention. Low leakage logic circuit 200 includes a control circuit 205 coupled to a logic circuit 210. Control circuit 205 includes a first transistor 215 and a first resistor 220, wherein the base terminal of first transistor 215 is connected to a control input terminal receiving control voltage $V_{ctrl}$ through a first control resistor 245. The collector terminal of first transistor 215 is connected to a supply voltage source providing supply voltage $V_{cc}$ through first resistor 220. The emitter terminal of first transistor 215 is grounded. In an embodiment, logic circuit 210 corresponds to double inverter circuit 100.

Control circuit 205 also includes a second transistor 225 and a second resistor 230, wherein the base terminal of second transistor 225 is connected to the collector terminal of first transistor 215. The collector terminal of second transistor 225 is connected to the supply voltage source through second resistor 230. The emitter terminal of second transistor 225 is grounded.

Control circuit 205 further includes a third transistor 235 and a first diode 240, wherein the gate terminal of third transistor 235 is connected to the collector terminal of second transistor 225. The drain terminal of third transistor 235 is connected to the supply voltage source. The source terminal of third transistor 235 is connected to a first circuit path (not shown) of logic circuit 210. The anode terminal of first diode 240 is connected to the source terminal of third transistor 235. The cathode terminal is connected to a second circuit path (not shown) of logic circuit 210. Output terminal 130 of logic circuit 210 provides the output of low leakage logic circuit 200.

In operation, control circuit 205 provides bias voltages to logic circuit 210 for different modes of operation. The source terminal of third transistor 235 supplies a first voltage Vc-en to the first circuit path (not shown) of logic circuit 210. The cathode terminal of first diode supplies a second voltage Inv-en to the second circuit path (not shown) of logic circuit 210.

When control voltage $V_{ctrl}$ at the base terminal of first transistor 215 is high (e.g., 5 volt magnitude), control circuit 205 operates in the ON state. Accordingly, first transistor 215 is turned ON. Due to this, only a low voltage (e.g., ground potential) is present at the collector terminal of first transistor 215. This voltage then goes to the base terminal of second transistor 225. As the voltage is less than the turn-on voltage of second transistor 225, second transistor 225 would be OFF. Hence, the voltage at the collector terminal of second transistor 225 would be very close to supply voltage $V_{cc}$ (due to the voltage drop in second resistor 230). This voltage turns ON third transistor 235. The magnitude of the voltage Vc-en at the source terminal of third transistor 235 is dropped to a small extent at the cathode terminal of first diode 240 (Inv-en). When control circuit 205 is ON, the first voltage Vc-en is very close to the voltage $V_{cc}$ and the second voltage Inv-en is less than the first voltage Vc-en.

When control voltage $V_{ctrl}$ at the base terminal of first transistor 215 is low (e.g., <1.2 volt magnitude), control circuit 205 operates in the OFF state. This low control voltage is not adequate to turn ON first transistor 215. However, second transistor 225 turns on since the supply voltage $V_{cc}$ is now applied at the base terminal of second transistor 225 through first resistor 220. This leads to low voltage at the collector terminal of second transistor 225 which is available at the gate terminal of third transistor 235. This voltage is not adequate to turn ON third transistor 235. However, the first voltage Vc-en in the form of a residual voltage is present at the source terminal of third transistor 235 which is reduced by first diode 240. This reduced voltage present at the cathode terminal of first diode 240 will be the second voltage Inv-en that is made available to logic circuit 210. The magnitude of the second voltage Inv-en is not sufficient to turn on the first circuit path of logic circuit 210. Thus, in the OFF state operation no current flows in logic circuit 210.

In comparison to double inverter circuit 100 where same supply voltage is connected to the collector terminal of transistors (105, 115), control circuit 205 is able to provide variable voltage outputs at the same time, i.e., high first voltage Vc-en and lower second voltage Inv-en. In the ON state it allows logic circuit 210 to source sufficiently high current to any circuit (e.g. RF switch, not shown) connected at output terminal 130, while at the same time reducing the leakage current in the OFF state by optimizing first and second resistors (110 and 120) of logic circuit 210. In addition, the leakage current will not multiply with the proportional increase in the number of logic circuits as in the prior art.

In an embodiment, by using first diode 240 the magnitude of the second voltage Inv-en is reduced by 0.7V from the magnitude of the first voltage Vc-en. In order to further reduce the second voltage Inv-en, more diodes can be connected in series, without departing from the scope of the present invention.

Figure 3:
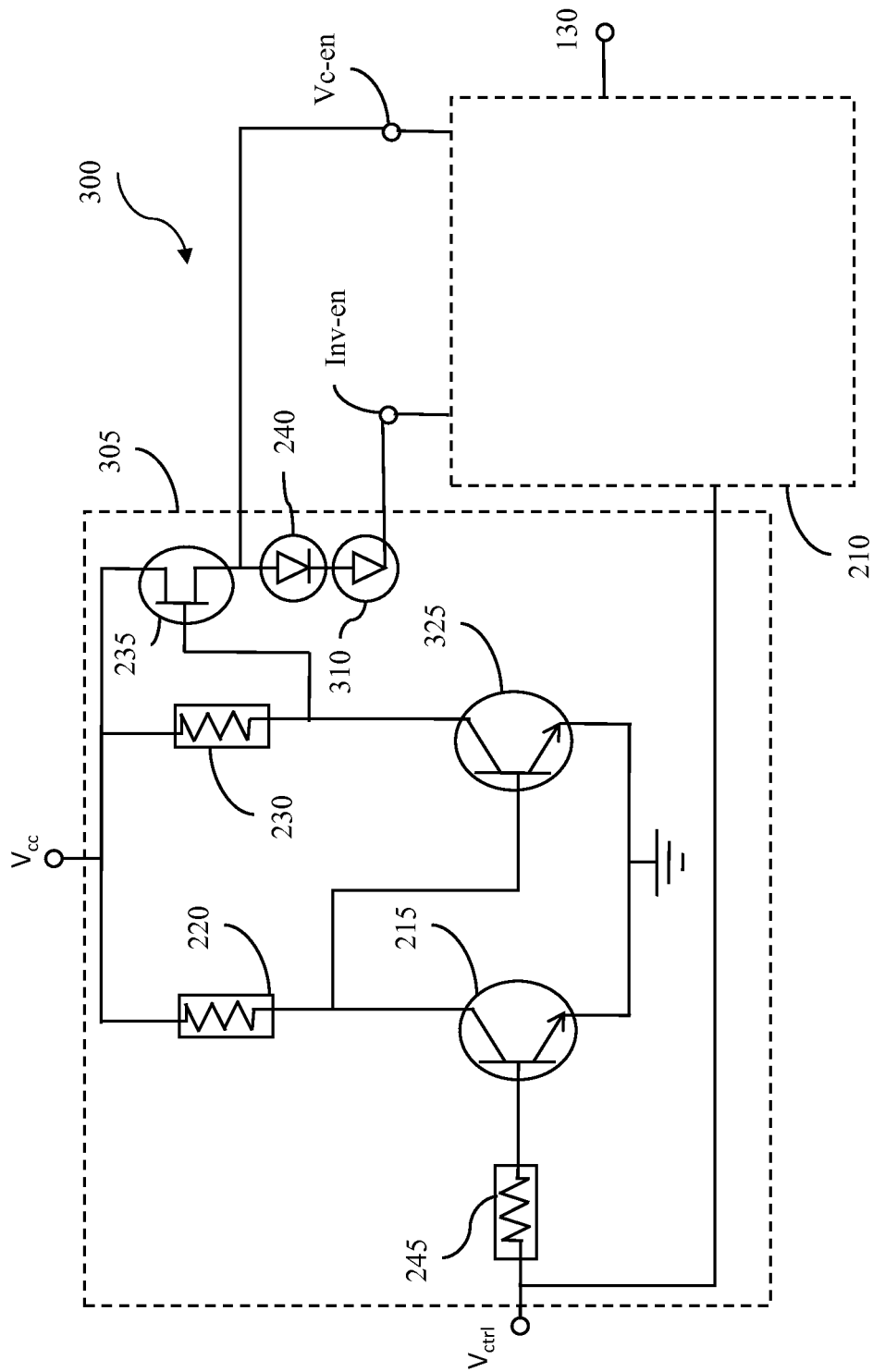
FIG. 3 illustrates a low leakage logic circuit in accordance with an embodiment of the invention.

FIG. 3 illustrates a low leakage logic circuit 300 in accordance with an embodiment of the invention. Low leakage logic circuit 300 includes a control circuit 305 and logic circuit 210. Control circuit 305 includes all the elements of control circuit 205 with an additional second diode 310. The elements referenced with same numbers in FIG. 3 as that of low leakage logic circuit 200 are connected in a similar fashion as that explained in FIG. 2, except for the connection from first diode 240.

In control circuit 205, the cathode terminal of first diode 240 is connected to the anode terminal of a second diode 310. The cathode terminal of second diode 310 is connected to second circuit path (not shown) of logic circuit 210.

In operation, control circuit 305 provides bias voltages to logic circuit 210 for different modes of operation. The source terminal of third transistor 235 supplies the first voltage Vc-en as explained earlier. However, the second voltage Inv-en is provided to the first circuit path (not shown) of logic circuit 210 by the cathode terminal of second diode 310 which is a further drop of the first voltage Vc-en due to second diode 310 connected in series with first diode 240.

Control circuit 205 is able to provide variable voltage outputs; high first voltage Vc-en and further reduced second voltage Inv-en due to series of first diode 240 and second diode 310.

Examples of transistors (105, 115, 215, and 225) include, but are not limited to, GaAs or InP Hetero-junction Bipolar Transistors (HBTs), Silicon or Silicon Germanium Bipolar-junction Transistors (Si BJTs or SiGe BJTs). An example of third transistor 235 includes, but is not limited to, a Field Effect Transistor (FET). Examples of first diode 240 and second diode 310 include, but are not limited to a FET arranged as a Schottkey diode or regular P-N Junction diode.

Figure 1:
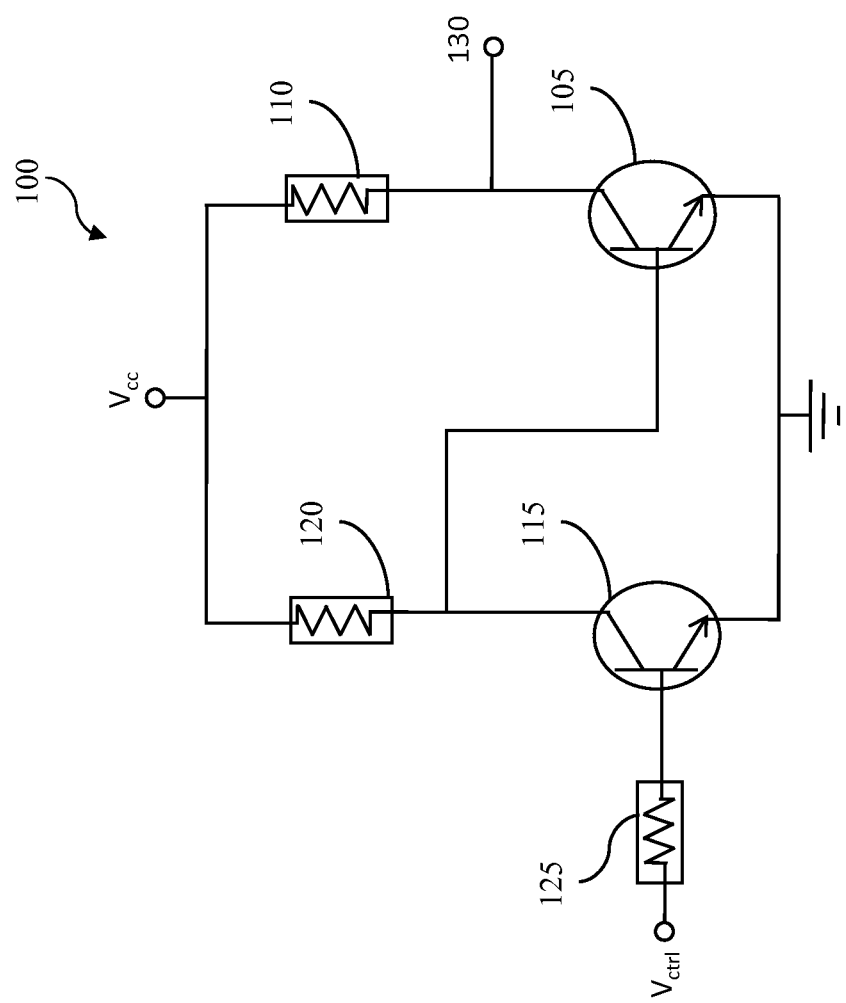
FIG. 1 illustrates a prior art double inverter logic circuit.
Figure 4:
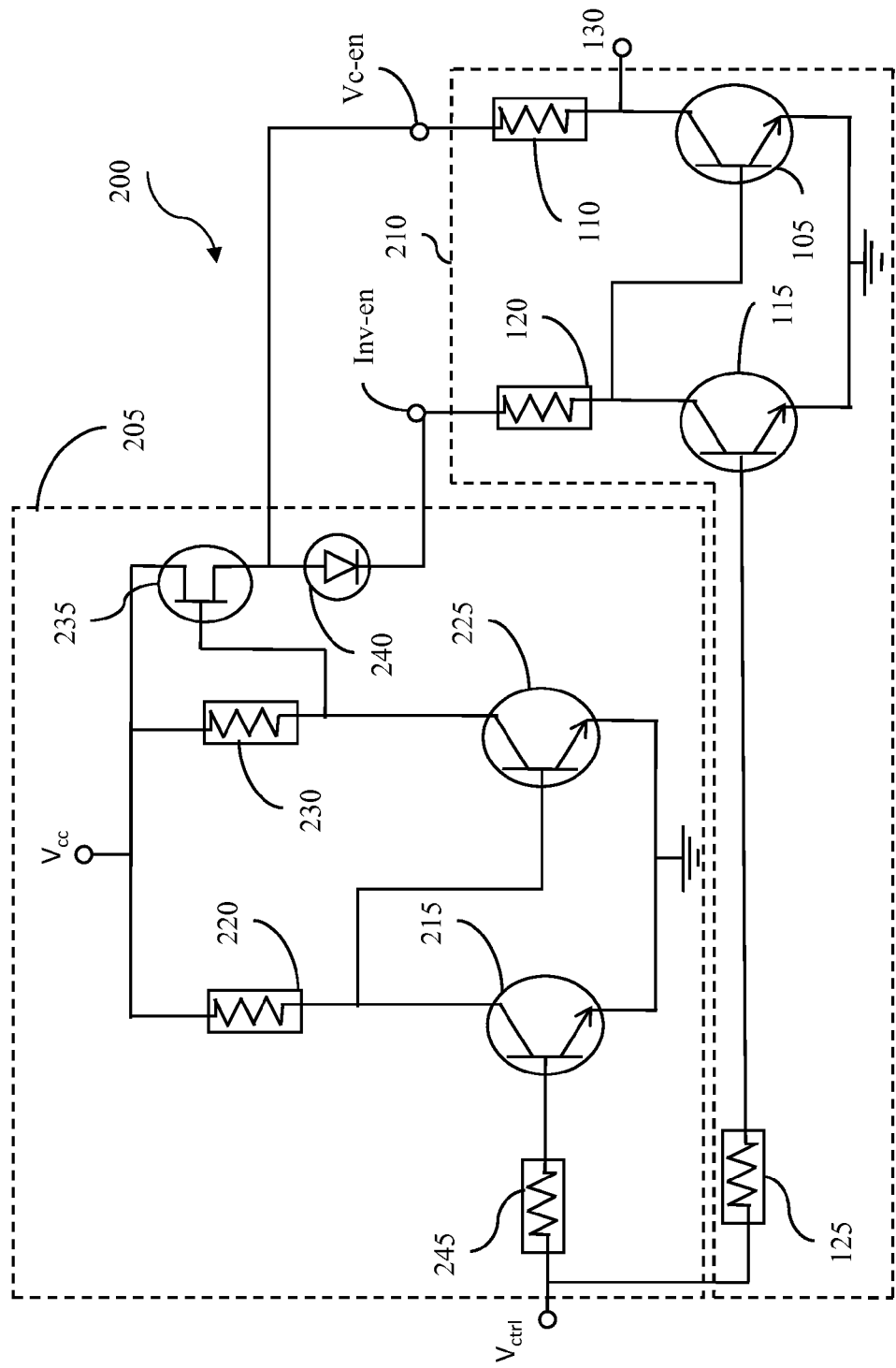
FIG. 4 illustrates a low leakage logic circuit in accordance with an embodiment of the invention.

FIG. 4 illustrates low leakage logic circuit 200 in accordance with an embodiment of the invention. The elements referenced with same numbers in FIG. 4 as that of double inverter logic circuit 100 are connected in a similar fashion as that explained in FIG. 1.

First resistor 110 of the logic circuit 210 is connected to the source terminal of third transistor 235 of control circuit 205. Second resistor 120 of the logic circuit 210 is connected to the cathode terminal of first diode 240 of control circuit 205.

Depending upon the magnitude/level of control voltage $V_{ctrl}$, control circuit 205 provides appropriate voltages Inv-en and Vc-en to logic circuit 210 as compared to the same supply voltage $V_{cc}$ supplied to double inverter circuit 100.

The first and second resistors (110 and 120) of logic circuit 210 in FIG. 4 are chosen to be significantly lower than the values of first and second resistors (110 and 120) of double inverter circuit 100, depending on the current sourcing requirement of output terminal 130. When control voltage $V_{ctrl}$ is high, logic circuit 210 is turned ON as second transistor 115 is ON and first transistor 105 is OFF. Thus, the voltage at output terminal 130 of logic circuit 210 is nearly equal to the first voltage Vc-en. As a result of a smaller value of first resistor 110 of logic circuit 210, a high/sufficient output current can flow through output terminal 130, which is higher in comparison to output current of double inverter circuit 100.

When control voltage $V_{ctrl}$ is low, logic circuit 210 is turned OFF as second transistor 115 is OFF, and first transistor 105 is OFF due to second voltage Inv-en being below the turn-on level of first transistor 105. Thus, both first transistor 105 and second transistor 115 are OFF, preventing any flow of current in the first circuit path and second circuit path. Thus, in OFF state no current flows in logic circuit 210.

In an embodiment, for example, first and second resistors (220 and 230) of the control circuit 205 have resistance values in Mega Ohms (e.g. >1 MΩ) to reduce the leakage current across the control circuit 205 and first and second resistors (110 and 120) of the logic circuit 210 have resistance values in Kilo Ohms (e.g. ~10-20KΩ) or less so as to supply sufficient current to bias the RF switch and maintain the high voltage level at the output terminal 130 for a large RF drive.

Figure 5:
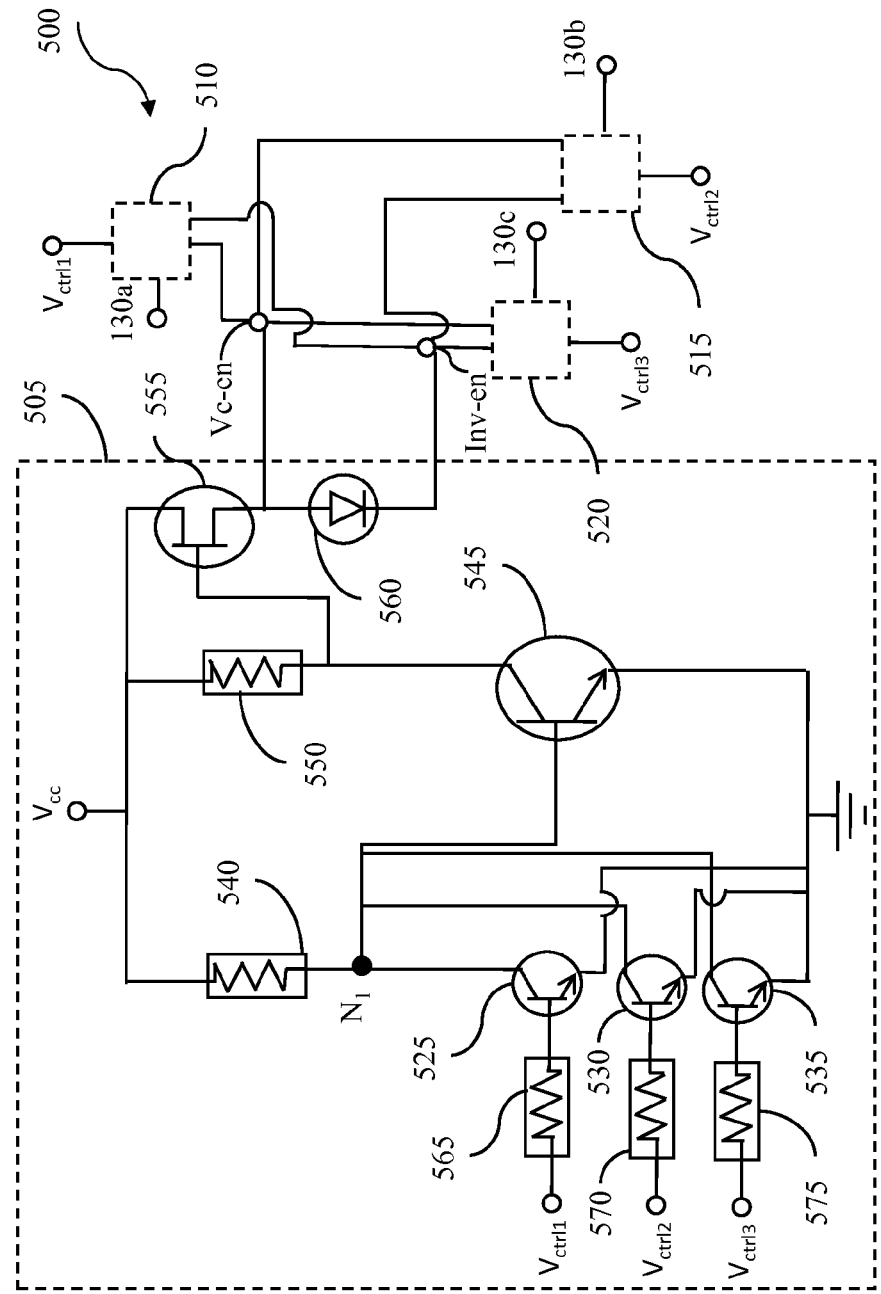
FIG. 5 illustrates a low leakage logic circuit in accordance with an embodiment of the invention.

FIG. 5 illustrates a low leakage logic circuit 500 in accordance with an embodiment of invention. Low leakage logic circuit 500 includes a control circuit 505 connected to a plurality of logic circuits (510, 515, and 520). Control circuit 505 includes a plurality of first transistors (525, 530, and 535) coupled in parallel and a first resistor 540. The base terminals of the plurality of first transistors (525, 530, and 535) are connected to a plurality of control input terminals that receives control voltages ($V_{ctrl1}$, $V_{ctrl2}$, and $V_{ctrl3}$) through a plurality of control resistors (565, 570, and 575), respectively. The collector terminals of the plurality of first transistors (525, 530, and 535) are joined at Node $N_1$ and connected to the supply voltage source through first resistor 540. The emitter terminals of the plurality of first transistors (525, 530, and 535) are grounded.

Control circuit 505 also includes a second transistor 545 and a second resistor 550. The base terminal of second transistor 545 is connected to the collector terminals of the plurality of first transistors (525, 530, and 535) at Node $N_1$. The collector terminal of second transistor 545 is connected to the supply voltage source through second resistor 550. The emitter terminal of second transistor 545 is grounded.

Control circuit 505 further includes a third transistor 555 and a first diode 560, wherein the gate terminal of third transistor 555 is connected to the collector terminal of second transistor 545. The drain terminal of third transistor 555 is connected to the supply voltage source. The source terminal of third transistor 555 is connected to the first circuit paths (not shown) of the plurality of logic circuits (510, 515, and 520). The anode terminal of first diode 560 is connected to the source terminal of third transistor 555. The cathode terminal of first diode 560 is connected to second circuit paths (not shown) of the plurality of logic circuits (510, 515, and 520).

In operation, control circuit 505 provides bias voltages to the plurality of logic circuits (510, 515, and 520) for different modes of operation. The source terminal of third transistor 555 supplies the first voltage Vc-en to the first circuit paths (not shown) of the plurality of logic circuits (510, 515, and 520). The cathode terminal of first diode 560 supplies the second voltage Inv-en to the second circuit paths (not shown) of the plurality of logic circuits (510, 515, and 520).

Control circuit 505 works in a similar manner to control circuits 205 and 305. In addition, when one or more of the plurality of control voltages ($W_{ctrl1}$, $V_{ctrl2}$, and $V_{ctrl3}$) is high, the plurality of first transistors (525, 530, and 535) is turned ON. This leads to second transistor 545 to be turned OFF which further leads to third transistor 555 to be turned on and hence supplying the first voltage Vc-en and the second voltage Inv-en. Thus, when any of the plurality of control voltages ($V_{ctrl1}$, $V_{ctrl2}$, and $V_{ctrl3}$) is high, control circuit 505 operates in an ON state. The magnitude of the first voltage Vc-en at source terminal of third transistor 555 is dropped to a small extent to form the second voltage Inv-en at the cathode terminal of first diode 560. When control circuit 505 is ON, high/sufficient current flows through output terminals (130a, 130b, and 130c) since the Vc-en is high and considering the low value of resistor used in the first circuit paths.

When all of the plurality of control voltages ($V_{ctrl1}$, $V_{ctrl2}$, and $V_{ctrl3}$) is low, the plurality of first transistors (525, 530, and 535) is turned OFF. This leads to second transistor 545 to be turned ON which further leads to third transistor 555 to be turned OFF. Since third transistor 555 is OFF, only a residual voltage will be supplied to the plurality of logic circuits (510, 515, and 520) in the form of the first voltage Vc-en and the second voltage Inv-en. In this arrangement, control circuit 505 is considered to be in an OFF state. The magnitude of the second voltage Inv-en is not sufficient to turn on the plurality of logic circuits (510, 515, and 520). Hence, when control circuit 505 is in the OFF state, logic circuits (510, 515, and 520) are also in the OFF state. Since no current flows through the plurality of logic circuits (510, 515, and 520) in the OFF state, it is beneficial to connect as many logic circuits to control circuit 505 as possible. In the OFF state, only control circuit 505 will draw current, limiting the overall leakage current to the current flowing through control circuit 505.

In an embodiment, for example, pluralities of logic circuits (510, 515, and 520) are connected to a single-pole triple-throw (SP3T) RF switch.

Figure 6:
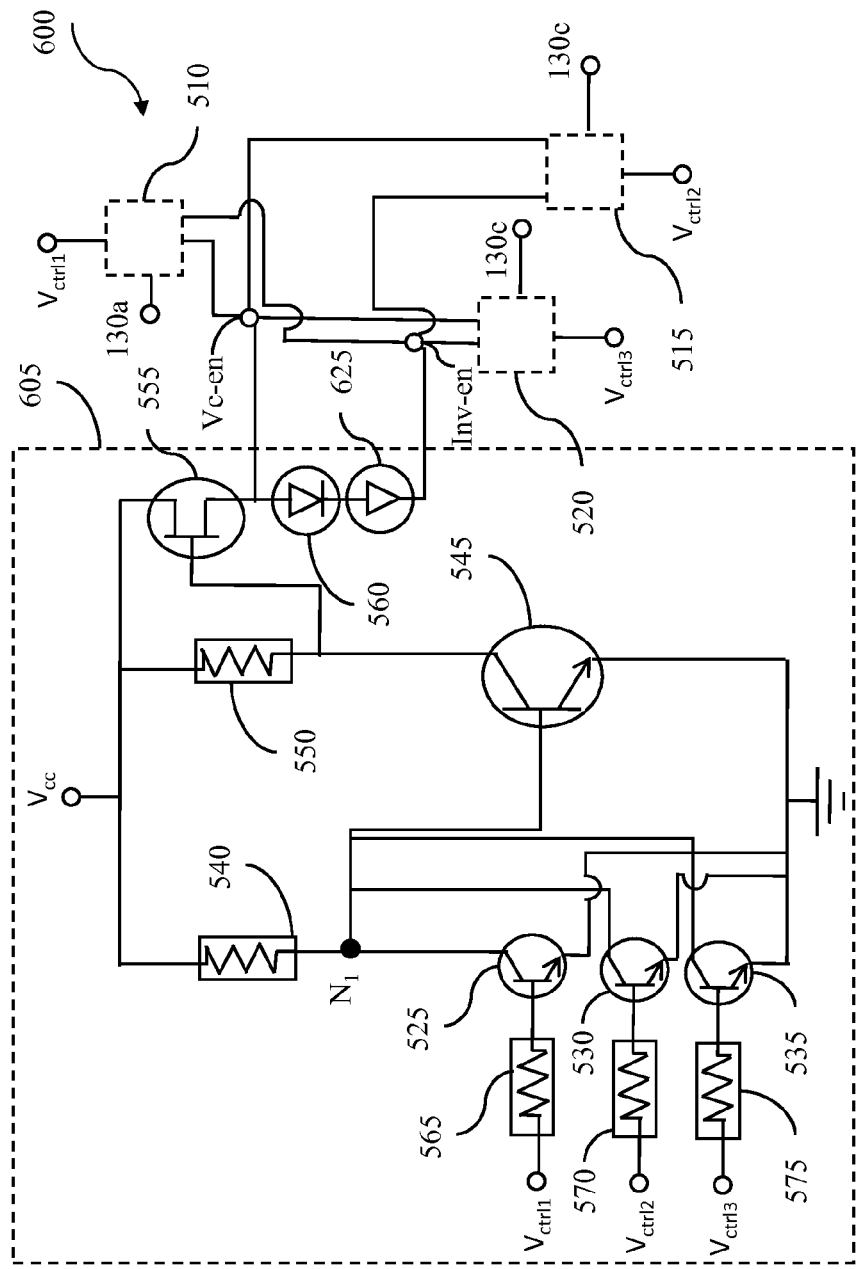
FIG. 6 illustrates a low leakage logic circuit in accordance with an embodiment of the invention.

FIG. 6 illustrates a low leakage logic circuit 600 in accordance with an embodiment of the invention. Low leakage logic circuit 600 includes a control circuit 605 connected to the plurality of logic circuits (610, 615, and 620). Control circuit 605 includes all the elements of control circuit 505 with an additional second diode 625. The elements referenced with same numbers in FIG. 6 as that of low leakage logic circuit 500 are connected in a similar fashion as that explained in FIG. 5, except for the connection from first diode 560.

In control circuit 605, the cathode terminal of first diode 560 is connected to the anode terminal of a second diode 625. The cathode terminal of second diode 625 is connected to second circuit paths (not shown) of the plurality of logic circuits (610, 615, and 620).

In operation, control circuit 605 provides bias voltages to the plurality of logic circuits (610, 615, and 620) for different modes of operation. The source terminal of third transistor 555 supplies the first voltage Vc-en as explained earlier. However, the second voltage Inv-en provided to the second circuit paths by the cathode terminal of second diode 625 is a further drop of the first voltage Vc-en due to second diode 625 connected in series with first diode 560.

Figure 7:
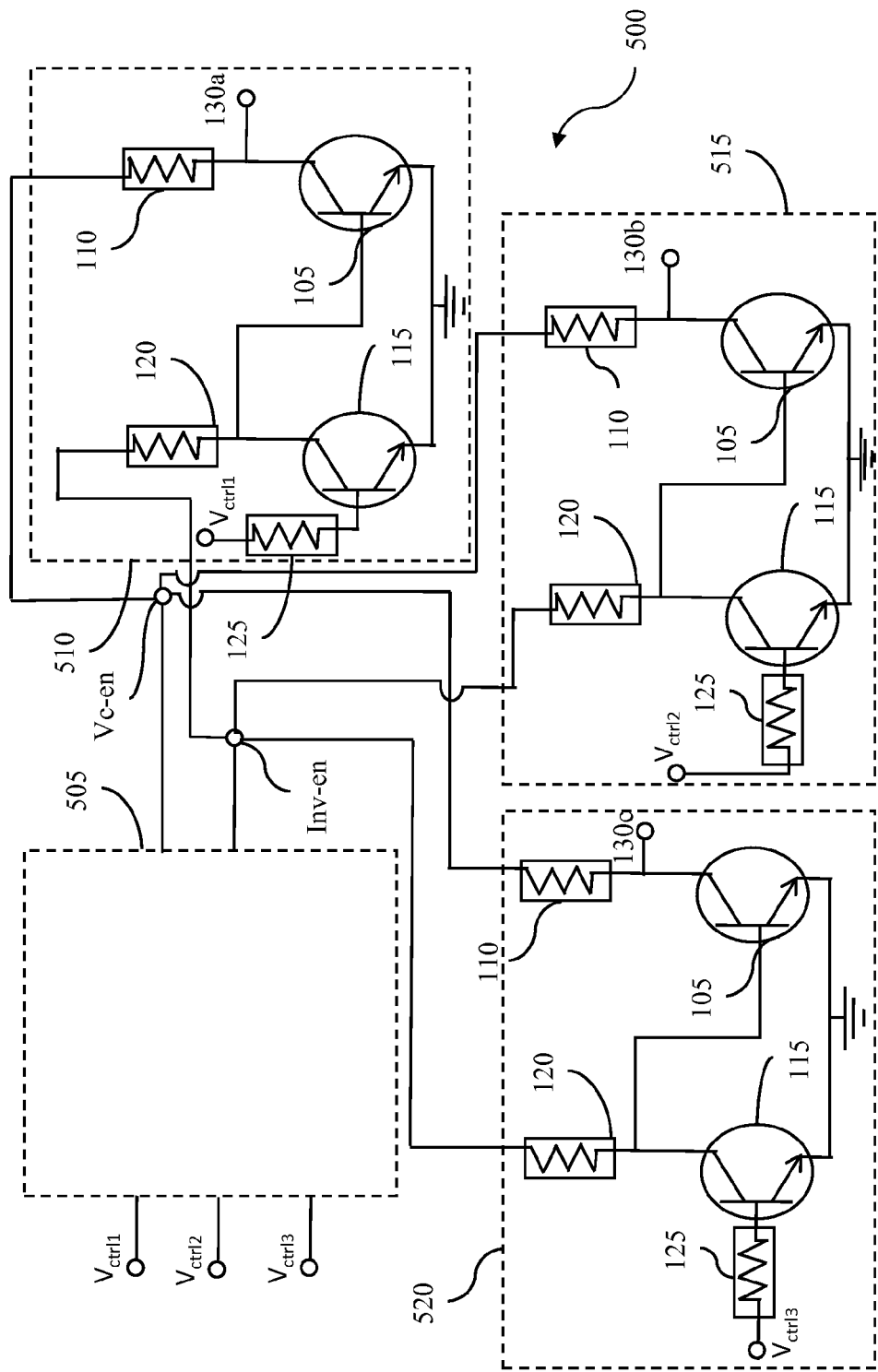
FIG. 7 illustrates a low leakage logic circuit in accordance with an embodiment of the invention.

FIG. 7 illustrates low leakage logic circuit 500 in accordance with an embodiment of the invention. The elements referenced with same numbers in FIG. 7 as that of low leakage logic circuit 500 are connected in a similar fashion as that explained in FIG. 4.

As depicted in FIG. 7, various first circuit paths formed by first transistor 105 and first resistor 110 of each of the plurality of logic circuits (510, 515, and 520) receive the first voltage Vc-en. Similarly, various second circuit paths formed by second transistor 115 and second resistor 120 of each of the plurality of logic circuits (510, 515, and 520) receive the second voltage Inv-en.

As discussed earlier, in ON state operation (e.g., when any of the plurality of control voltages ($V_{ctrl1}$, $V_{ctrl2}$, and $V_{ctrl3}$) is high), the corresponding logic circuit(s) that receive high control voltage, also operates in an ON state. Since, the first voltage Vc-en is high (nearly equal to $V_{cc}$) sufficient currents passes through the associated output terminals (130a, 130b, 130c) to drive any circuits connected thereto.

When all control voltages ($V_{ctrl1}$, $V_{ctrl2}$, and $V_{ctrl3}$) are low, the plurality of logic circuits (510, 515, and 520) is turned OFF as second transistor 115 in the plurality of logic circuits (510, 515, and 520) is OFF, and first transistor 105 in the plurality of logic circuits (510, 515, and 520) is OFF due to the second voltage Inv-en being below the turn-on voltage level of first transistor 105 in the plurality of logic circuits (510, 515, and 520). Thus, both first transistors 105 and second transistors 115 are OFF, preventing any flow of current in the first circuit paths and second circuit paths. Thus, in the OFF state no current flows in the plurality of logic circuits (510, 515, and 520).

Figure 8:
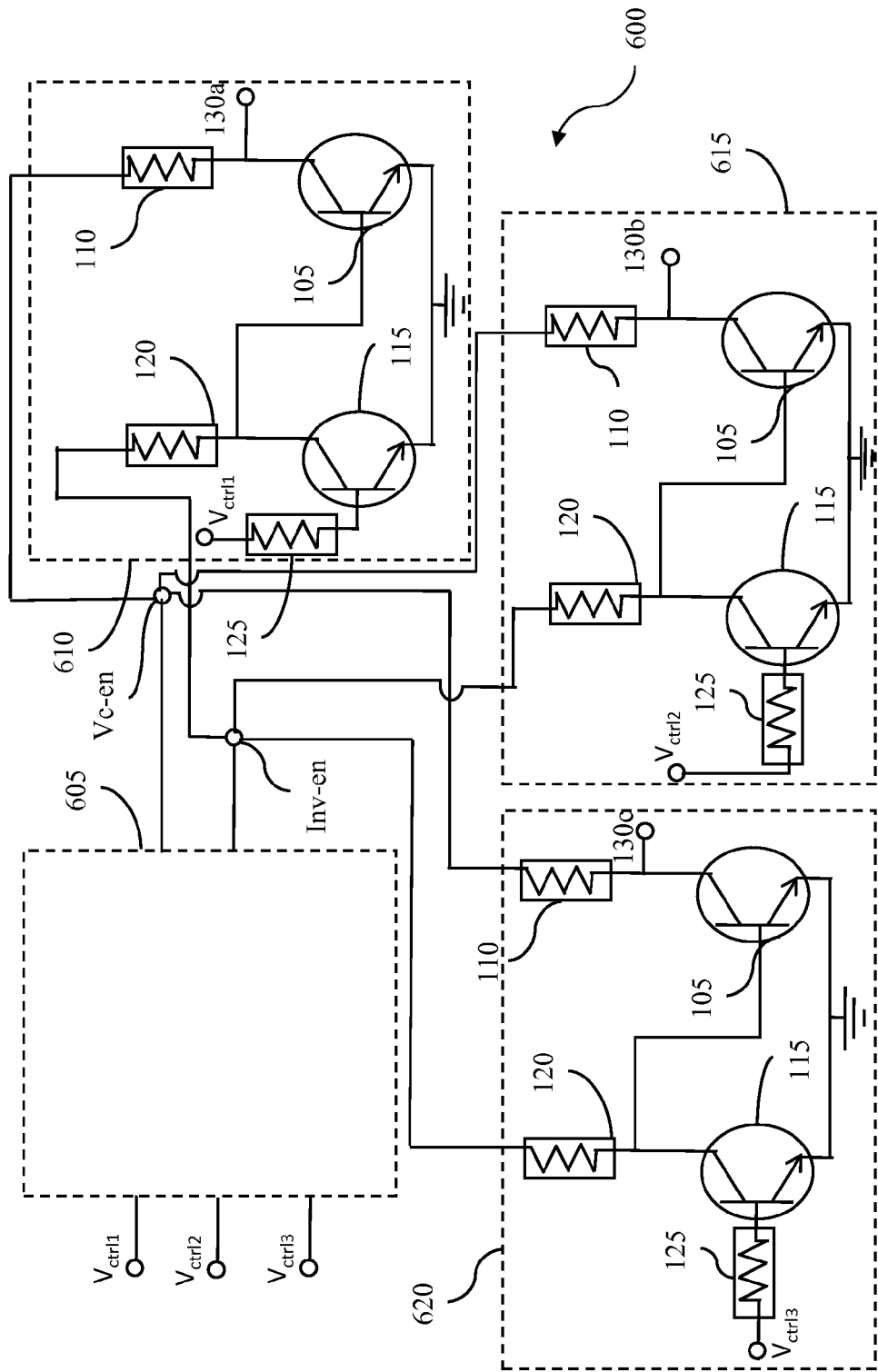
FIG. 8 illustrates a low leakage logic circuit in accordance with an embodiment of the invention.

FIG. 8 illustrates low leakage logic circuit 600 in accordance with an embodiment of the invention. The elements referenced with same numbers in FIG. 8 as that of low leakage logic circuit 600 are connected in a similar fashion as that explained in FIG. 6.

In operation, each of the plurality of logic circuits (610, 615, and 620) operate the same way as the plurality of logic circuits (510, 515, and 520) explained in FIG. 4 except for a further drop in leakage current across second circuit paths when the plurality of logic circuits (510, 515, and 520) is in the ON state.

Figure 9:
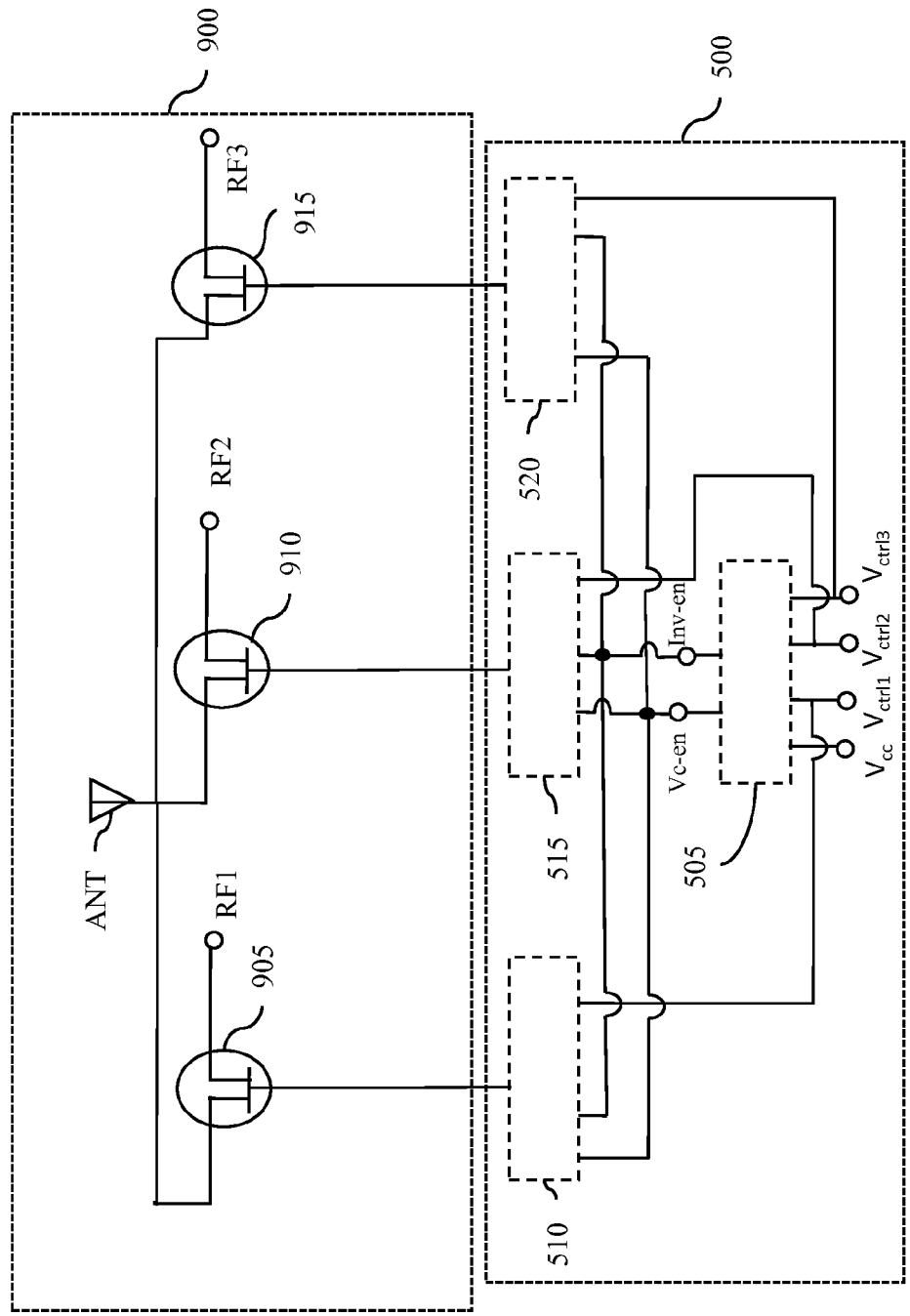
FIG. 9 illustrates a low leakage logic circuit connected to a switch circuit in accordance with an embodiment of the invention.

FIG. 9 illustrates low leakage logic circuit 500 connected to a switch circuit 900 in accordance with an embodiment of the invention. Switch circuit 900 is coupled with low leakage logic circuit 500 at output terminals (130a, 130b, 130c). Switch circuit 900 includes the plurality of RF switches (905, 910, and 915). There are same numbers of RF switches corresponding to the number of logic circuits.

In operation, control circuit 505 when turned ON turns the plurality of logic circuits (510, 515, and 520) ON and this provides sufficient voltage to turn on or drive RF switches (905, 910, and 915). When control circuit 505 is turned OFF it turns OFF the plurality of logic circuits (510, 515, and 520) which makes RF switches (905, 910, and 915) OFF.

The embodiments of the invention in low leakage logic circuit 200 provide several advantages. Control circuit 205 provides two varying bias voltages to logic circuit 210 in comparison to standard double inverter circuit 100 which is biased by a single voltage source. When control circuit 205 is ON, the first voltage Vc-en supplied from control circuit 205 is high; resulting in a high current to flow across output terminal 130 of low leakage logic circuit 200. This is useful for high power output requirements of the RF switch. When logic circuit 210 is OFF, the second voltage Inv-en is below the turn on voltage level of first transistor 105 in logic circuit 210, thus turning the first circuit path of logic circuit 210 to OFF. Accordingly, both first transistor 105 and second transistor 115 are OFF, preventing any flow of current in the first circuit path and second circuit path. Thus, in the OFF state no current flows in logic circuit 210. In an embodiment, when the low leakage logic circuit 500 is configured to control and bias a single-pole triple-throw (SP3T) RF switch as shown in FIG. 9, the leakage current was reduced by more than 60% compared to standard double inverter circuit 100 (<3 μA compared to 8.5 μA).

For the leakage current of whole standard double inverter circuit 100 to be minimized, resistors with large values were required (e.g. >1 MO). The larger the resistors are, the lower the leakage current will be. However, the problem exhibited in the standard double inverter circuit 100 where the RF power handling of the RF switch is degraded because of the plurality of logic circuits 100 not being able to source enough current is solved by having control circuit 205 act as a master circuit to the plurality of logic circuits (510, 515, and 520). The current sourcing capability of the logic circuit 210 is determined by first and second resistors (110 and 120) of logic circuit 210. First and second resistors (110 and 120) of logic circuit 210 need to be of a reasonably low value (e.g. ~10-20KΩ) or less so as to supply sufficient current to bias RF switch and maintain the voltage level particularly under large RF drive, i.e. minimizing voltage drop across the first and second resistors (110 and 120) of logic circuit 210 under large current operation. Thus, the present invention provides low leakage logic circuit that can source large currents without compromising the power performance of the RF switch. While the invention has been illustrated for the case of GaAs HBTs, it may be practiced using other technologies. If other technologies are used, a different voltage drop may be required to achieve an appropriate drop to obtain the second voltage Inv-en. This can be done by connecting additional diodes in series with the existing ones.

While various embodiments of the present invention have been illustrated and described, it will be clear that the control circuits and the logic circuits of the low leakage logic circuits can be fabricated as a single integrated circuit, or as discrete circuit components connected together. Further, various other possible combinations of the electronic components may also be used without deviating from the scope of the invention.

While various embodiments have been illustrated and described, it will be clear that the invention is not limited to these embodiments only. For a person having ordinary skill in the art, it will be apparent that numerous modifications, changes, variations, substitutions, and equivalents can be used without deviating from the scope and spirit of the invention, as described in the claims that follow.

What is claimed is:

1. A control circuit for a logic circuit, wherein the control circuit receives a control signal at a control input terminal and provides a first voltage and a second voltage to the logic circuit, the control circuit comprising:
   a first transistor and a first resistor, the base terminal of the first transistor being connected to the control input terminal, the collector terminal of the first transistor is connected to a supply voltage source through the first resistor, and the emitter terminal of the first transistor is grounded;
   a second transistor and a second resistor, the base terminal of the second transistor being connected to the collector terminal of the first transistor, the collector terminal of the second transistor is connected to the supply voltage source through the second resistor, and the emitter terminal of the second transistor is grounded;
   a third transistor, the gate terminal of the third transistor being connected to the collector terminal of the second transistor, the drain terminal of the third transistor is connected to the supply voltage source, the source terminal of the third transistor supplies the first voltage to the logic circuit; and
   a voltage drop component, wherein an input terminal of the voltage drop component is connected to the source terminal of the third transistor, and an output terminal of the voltage drop component supplies the second voltage to the logic circuit,
   wherein the magnitudes of the first voltage and second voltage are such that the logic circuit conducts no current when the logic circuit operates in OFF state.

2. The control circuit according to claim 1, wherein the first voltage is supplied to a first circuit path of the logic circuit.

3. The control circuit according to claim 1, wherein the second voltage is supplied to a second circuit path of the logic circuit.

4. The control circuit according to claim 1, wherein the base terminal of the first transistor is connected to the control input terminal through a control resistor.

5. The control circuit according to claim 1, wherein the logic circuit is in a double inverter circuit type component.

6. The control circuit according to claim 1, wherein the voltage drop component comprises of one or more diodes connected in series.

7. The control circuit according to claim 1, wherein the voltage drop component comprises of one or more FETs.

8. The control circuit according to claim 1, wherein the first and second resistors have resistance values greater than the resistance of the plurality of resistors of the logic circuit.

9. The control circuit according to claim 1, wherein the first transistor, the second transistor, and the plurality of transistors of the logic circuit are bipolar-junction transistors (BJTs), and the third transistor is a field effect transistor (FET).

10. A control circuit for a plurality of logic circuits, wherein the control circuit receives control signals at a plurality of control input terminals and provides a first voltage and a second voltage to the plurality of logic circuits, the control circuit comprising:
   a plurality of first transistors coupled in parallel and a first resistor, the base terminals of the plurality of first transistors being connected to a plurality of control input terminals, the collector terminals of the plurality of first transistors are joined and connected to a supply voltage source through the first resistor, and the emitter terminals of the plurality of first transistors are grounded;
   a second transistor and a second resistor, wherein the base terminal of the second transistor is connected to the collector terminals of the plurality of first transistors, the collector terminal of the second transistor is connected to the supply voltage source through the second resistor, and the emitter terminal of the second transistor is grounded;
   a third transistor, wherein the gate terminal of the third transistor is connected to the collector terminal of the second transistor, the drain terminal of the third transistor is connected to the supply voltage source, the source terminal of the third transistor supplies the first voltage to the plurality of logic circuits; and
   a voltage drop component, wherein an input terminal of the voltage drop component is connected to the source terminal of the third transistor, and an output terminal of the voltage drop component supplies the second voltage to the plurality of logic circuits, wherein the magnitudes of the first voltage and second voltage are such that the plurality of logic circuits conducts no current when the plurality of logic circuits logic circuit operates in OFF state.

11. The control circuit according to claim 10, wherein the first voltage is supplied to a plurality of first circuit paths of the plurality of logic circuits.

12. The control circuit according to claim 10, wherein the second voltage is supplied to a plurality of second circuit paths of the plurality of logic circuits.

13. The control circuit according to claim 10, wherein the base terminals of the plurality of first transistors are connected to the control input terminals through a plurality of control resistors.

14. The control circuit according to claim 10, wherein the voltage drop component comprises of one or more diodes connected in series.

15. The control circuit according to claim 10, wherein the first and second resistors have resistance values greater than the resistance of one or more resistors of the plurality of logic circuits.

16. The control circuit according to claim 10, wherein the plurality of first transistors, the second transistor, and the plurality of transistors of the plurality of logic circuits are bipolar transistors (BJTs), and the third transistor is a field effect transistor (FET).

17. The control circuit according to claim 10, wherein each of the plurality of logic circuits comprises:
   a fourth transistor and a third resistor, wherein:
      the base terminal of the fourth transistor is connected to one of the plurality of control signals, the collector terminal of the fourth transistor is connected to an output terminal of the voltage drop component through the third resistor, and
      the emitter terminal of the fourth transistor is grounded; and
   a fifth transistor and a fourth resistor, wherein:
      the base terminal of the fifth transistor is connected to the collector terminal of the fourth transistor, the collector terminal of the fifth transistor is connected to the source terminal of the third transistor that provides a first voltage through the fourth resistor, and the emitter terminal of the fifth transistor is grounded, wherein a voltage across the collector terminal of the fifth transistor of the plurality of logic circuits is used to bias an RF switch.

18. A control circuit for a plurality of double inverter logic circuits, wherein the control circuit receives a plurality of control signals at a plurality of control input terminals and provides a first voltage and a second voltage to the double inverter logic circuit, the control circuit comprising:

a one or more first transistors coupled in parallel and a first resistor, the base terminals of the plurality of first transistors are connected to the plurality of control input terminals, the collector terminals of the plurality of first transistors are joined and connected to a supply voltage source through the first resistor, and the emitter terminals of the plurality of first transistors are grounded;

a second transistor and a second resistor, the base terminal of the second transistor being connected to the collector terminals of the plurality of first transistors, the collector terminal of the second transistor is connected to the supply voltage source through the second resistor, and the emitter terminal of the second transistor is grounded;

a third transistor, wherein the gate terminal of the third transistor is connected to the collector terminal of the second transistor, and the drain terminal of the third transistor is connected to the supply voltage source;

a voltage drop component, an input terminal of the voltage drop component being connected to the source terminal of the third transistor;

a fourth transistor and a third resistor in each of the plurality of double inverter logic circuits, wherein:

the base terminal of the fourth transistor is connected to one of the plurality of control signals, the collector terminal of the fourth transistor is connected to an output terminal of the voltage drop component through the third resistor, and the emitter terminal of the fourth transistor is grounded; and a fifth transistor and a fourth resistor in each of the plurality of double inverter logic circuits, wherein:

the base terminal of the fifth transistor is connected to the collector terminal of the fourth transistor, the collector terminal of the fifth transistor is connected to the source terminal of the third transistor that provides a first voltage through the fourth resistor, and the emitter terminal of the fifth transistor is grounded, wherein a voltage across the collector terminal of the fifth transistor of the plurality of double inverter logic circuits is used to bias an RF switch.

* * * * *